US007083444B1

(12) United States Patent
Barina et al.

(10) Patent No.: US 7,083,444 B1
(45) Date of Patent: Aug. 1, 2006

(54) DAUGHTERBOARD WITH SENSE AND RELEASE SYSTEM

(75) Inventors: Richard M. Barina, Wellington, FL (US); Jason Michael Campbell, Raleigh, NC (US); Dean F. Herring, Youngsville, NC (US); Edward J. McNulty, Raleigh, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/079,752

(22) Filed: Mar. 14, 2005

(51) Int. Cl.
*H01R 13/62* (2006.01)
(52) U.S. Cl. ..................... 439/157; 439/372
(58) Field of Classification Search ............... 439/152, 439/157
See application file for complete search history.

(56) References Cited

U.S. PATENT DOCUMENTS

| | | | | |
|---|---|---|---|---|
| 4,071,722 | A * | 1/1978 | Hart ........................ 200/50.1 |
| 4,521,063 | A * | 6/1985 | Milc ........................... 439/55 |
| 4,537,454 | A * | 8/1985 | Douty et al. ................ 439/157 |
| 5,139,430 | A * | 8/1992 | Lewis et al. ................ 439/157 |
| 5,162,979 | A * | 11/1992 | Anzelone et al. ........... 361/686 |
| 5,191,970 | A * | 3/1993 | Brockway et al. .......... 200/335 |
| 5,340,340 | A * | 8/1994 | Hastings et al. .............. 439/64 |
| 5,343,009 | A * | 8/1994 | Araoka et al. .............. 200/322 |
| 5,473,499 | A | 12/1995 | Weir ........................... 361/58 |
| 5,989,043 | A * | 11/1999 | Han et al. .................... 439/157 |
| 6,069,796 | A * | 5/2000 | Hastings et al. ............. 361/754 |
| 6,182,173 | B1 | 1/2001 | Grosser et al. .............. 710/103 |
| 6,312,275 | B1 * | 11/2001 | Tortorella ................... 439/341 |
| 6,956,745 | B1 * | 10/2005 | Kerrigan et al. ............ 361/726 |
| 2005/0014403 | A1 * | 1/2005 | Joist .......................... 439/157 |

OTHER PUBLICATIONS

OPTO 22. Brain Boards, Classic Pamux B4 Installation Notes [online], [retrieved on Feb. 22, 2005]. Retrieved from the Internet <URL: www.opto22.com, 2004.

* cited by examiner

*Primary Examiner*—Hae Moon Hyeon
(74) *Attorney, Agent, or Firm*—Synnestvedt & Lechner LLP; Martin McKinley

(57) ABSTRACT

A printed circuit board is configured as a daughterboard to include at least one lever pivotable between open and closed positions. The lever applies leverage to a card guide structure to selectively urge the daughterboard into or out of engagement with a connector of a motherboard. A manually operable pivotable latch member is mounted on the daughterboard for selectively retaining the lever(s) in a closed position. The latch member may be spring biased so that it maintains the lever(s) in the closed position and returns to a latch position after being manually pivoted to release the lever(s). The lever(s) may be spring biased toward the open position. An optical switch may be provided on the daughterboard to sense whether the lever is in a closed position, and to responsively interrupt power and/or bus signals to the daughterboard when the lever is not sensed in the closed position.

21 Claims, 9 Drawing Sheets

DAUGHTERBOARD WITH SENSE AND RELEASE SYSTEM

FIELD OF THE INVENTION

This invention relates generally to computers and other information processing systems that use "hot pluggable" daughterboard cards and, more particularly, to a specially configured daughterboard card including a hinged lever, pivotable release mechanism, and optical switch assembly that allows daughterboard cards to be "hot plugged" into (or from) a computer without turning off the computer's power.

DISCUSSION OF RELATED ART

A typical computer includes a motherboard and/or backplane with a plurality of headers. The headers are the receptacles for daughterboards (e.g., adapters or cards) which can be used to expand the capacity and/or functionality of the computer. A technique termed "hot plugging", "hot swap", or variations thereof enables the insertion and/or removal of daughterboards while the computer is operational. Even though hot plugging is a desirable goal, if not done properly, it can cause problems which over time adversely affect the operability of the computer system. A likely problem is pitting of the metal used on the connecting pins located on the daughterboard and/or the header. A main cause of pitting is believed to be electrical arcing which occurs at the electrical contacts while interconnection is made or broken. Another problem is electrical noise which can adversely affect the performance of the system. The cause of this noise is believed to be the large change in current over a short period of time (di/dt) at the instance when the connection is made between power pins on the card and the socket. This problem is particularly severe when hot-plugging a daughterboard card with a large amount of decoupling capacitance. Finally, the large surge of current is likely to cause voltage transients onto the computer system backplane. The voltage transients can cause loss of data, incorrect program execution and, in severe situations, damage to delicate hardware components.

One approach uses electrical circuits and switches for coupling the card's power and signal busses to the system's power and signal busses. U.S. Pat. No. 5,473,499 to Weir, provides an example of the solution. However, this implementation requires a predetermined time delay between connection of the power busses and the signal busses. The predetermined time delay enables the voltages on the card to be stabilized before the signal busses are connected. It appears as if operator's intervention is required to set the predetermined time which may be different for different systems and even in the same system, may have to change as components age. Due to the likelihood of human error, there is a need to provide a fully automated system which does not require human intervention, other than to insert/remove the card.

Another approach is described in U.S. Pat. No. 6,182,173 to Grosser et al., the entire disclosure of which is hereby incorporated herein by reference. Grosser describes a system for removing and attaching an adapter card to a computer bus while power is applied to the computer. The computer system has a header for receiving the adapter card and a bus for electrically coupling the adapter card to the bus. The bus carries power and bus signals to the adapter card. The system includes an optical switch and means, coupled to the optical switch, for disconnecting and connecting power and bus signals to the adapter card slot. A rotatable cover plate has open and closed positions wherein, in the closed position, the cover plate covers the adapter card slot physically preventing the adapter card from being inserted into slot. The rotatable cover plate includes a tab, and the tab is inserted into an opening in the optical switch such that power and bus signals are connected to the adapter card slot when the cover plate is in the closed position. The tab is removed from the opening in said optical switch when the cover plate is rotated into the open position such that power and bus signals are removed from the adapter card slot when the cover plate is in the open position.

SUMMARY OF THE INVENTION

The present invention provides a daughterboard with a sense and/or release system. The daughterboard is somewhat conventional in nature in that it includes circuitry and/or electrical components for a particular purpose and is configured to mate with a connector of a motherboard of an information processing system that includes a housing. However, the daughterboard is specially configured to include at least one lever pivotably mounted to its printed circuit board so that the lever is pivotable between an open position, in which it will not interfere with the housing during removal from the connector, and a closed position, in which it will interfere with the housing to prevent its removal. The daughterboard is further configured with a pivotably mounted latch member that is pivotable between a latch position and an unlatch position. In the latch position, the latch member is capable of retaining the lever(s) in the closed position. In the unlatch position, the latch member permits the lever(s) to be moved from the closed position toward the open position. The latch member may be spring biased to the latch position, e.g. by a resilient cantilevered tang that is integrally formed with said latch member. Each lever may be spring biased toward the open position, e.g. by a resilient cantilevered tang that is integrally formed with the lever. Each lever may include a first cam surface configured to impinge upon the housing and urge the daughterboard into a fully seated position with the connector of the information processing system as the lever is pivoted toward the closed position, and a second cam surface configured to impinge upon the housing and urge the daughterboard out of the fully seated position as the lever is pivoted toward the open position. This provides a release mechanism.

Optionally, the daughterboard may be further configured to include an optical switch that is capable of sensing the presence of one of the levers when that lever is in the closed position. A tab may be provided on the lever for this purpose. The information processing system and/or daughterboard may be configured to interrupt power and/or bus signals to the daughterboard when the optical switch changes from a closed position (lever present) to an open position (lever absent), and to restore power and/or bus signals to the daughterboard when the optical switch is in the closed position (lever present). A light source is provided on the daughterboard that is powered by power signals from the information processing system such that extinguishing of a "POWER ON" light source on the daughterboard confirms that power is no longer being received by the daughterboard, and that the daughterboard may be safely removed from the system.

DETAILED DESCRIPTION OF THE PREFERRED EMBODIMENTS

The present invention provides a specially configured daughterboard for electrical connection with a conventional motherboard connector of an information processing system, such as a personal computer (PC), workstation or any other machine using a microprocessor or other processor as a controller (such as a network server, hub, router, etc.). The information processing system is conventional in that it includes a motherboard having a standard connector/header for receiving a daughterboard, a housing including a card guide for receiving a daughterboard, a power supply, etc. The daughterboard is conventional in nature in that it is a circuit card for performing desired functions. Such daughterboards, and their conventional aspects, such as a complementary connectors (such as a card edge connector or header) are widely known in the prior art and thus are not described in great detail herein.

Figure 1:
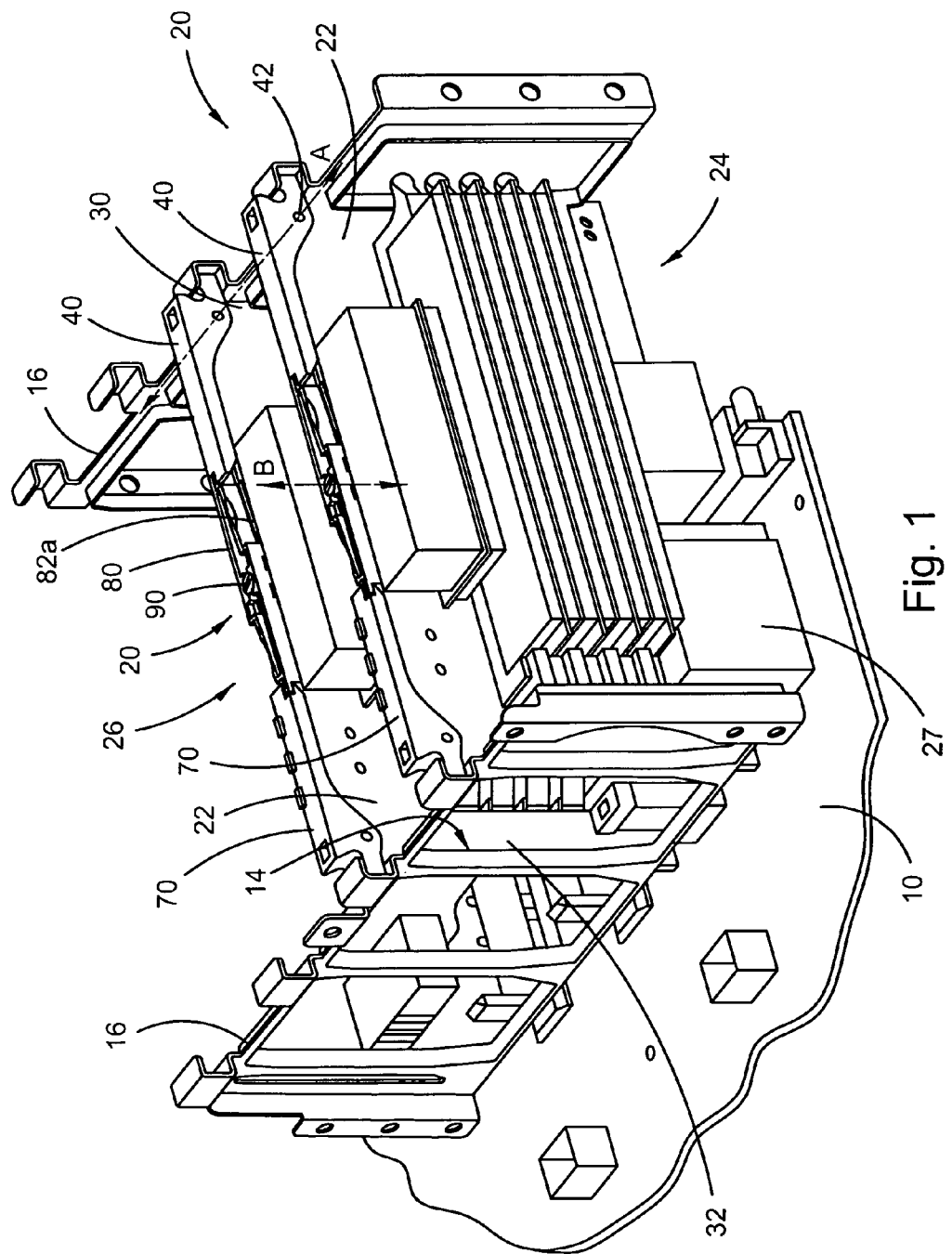
FIG. 1 is a top perspective view of an exemplary daughterboard in accordance with the present invention, shown mounted to a motherboard of an information processing system.
Figure 2:
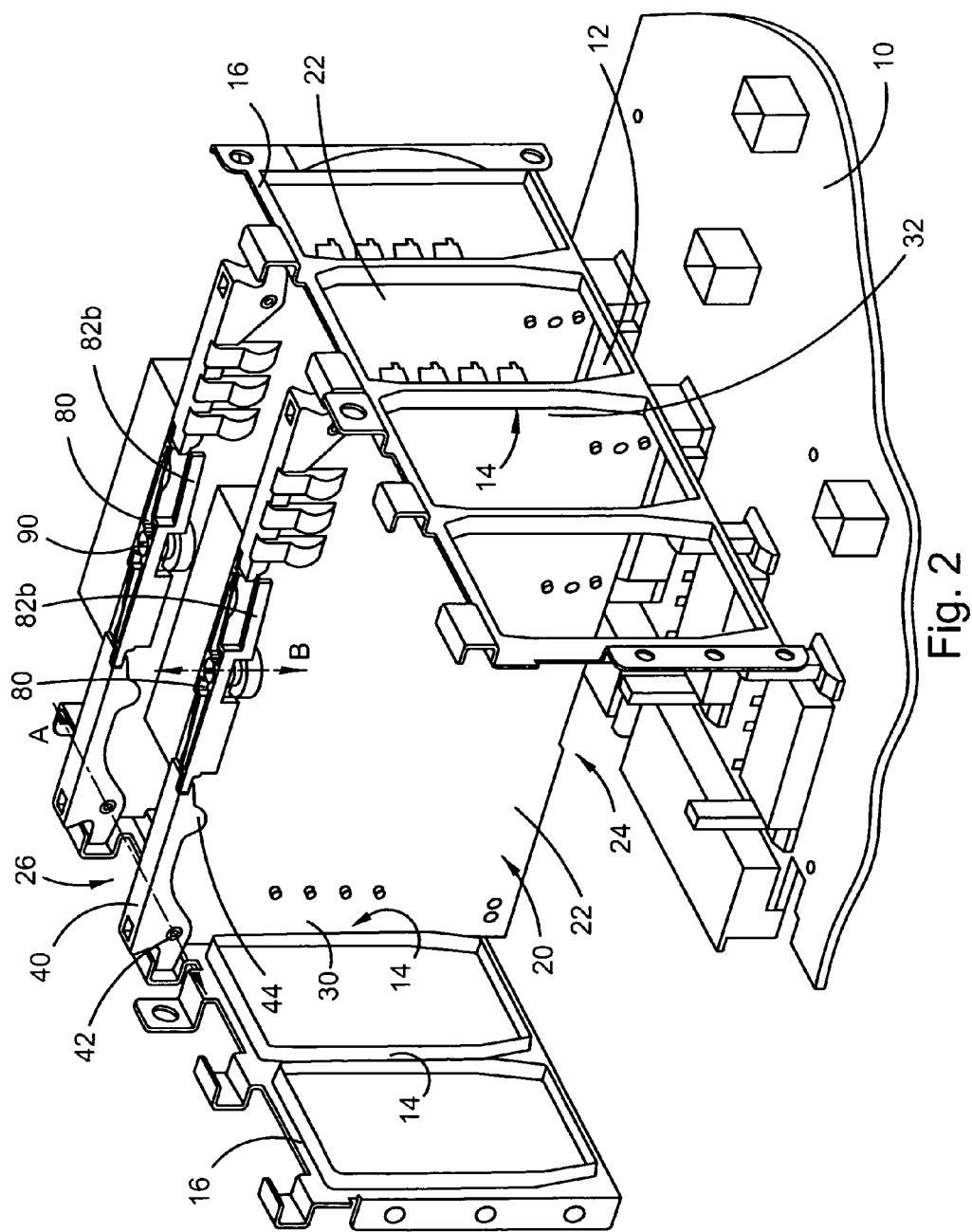
FIGS. 2 and 3 are bottom perspective views of the daughterboard of FIG. 1.

Referring now to FIGS. 1–8, an exemplary daughterboard 20 in accordance with the present invention is shown. For illustrative purposes, the daughterboard is shown mounted to a motherboard 10 of an information processing system. As best shown in FIG. 2, the motherboard 10 has a conventional connector, such as a conventional header, for forming electrical connections with a daughterboard received therein.

As best shown in FIGS. 1 and 2, the daughterboard 20 includes a printed circuit board 22 including circuitry and/or electronic components (omitted for illustrative simplicity) for providing desired functionality. The printed circuit board 22 has a lower edge 24 and an upper edge 26 opposite the lower edge 24. A conventional connector 27 (FIG. 1) that is complementary to the motherboard's connector 12 is provided for mating therewith. Edge portions 30, 32 of the daughterboard 20 are received in a channel 14 of a conventional card guide structure 16 of the information processing system.

Figure 8:
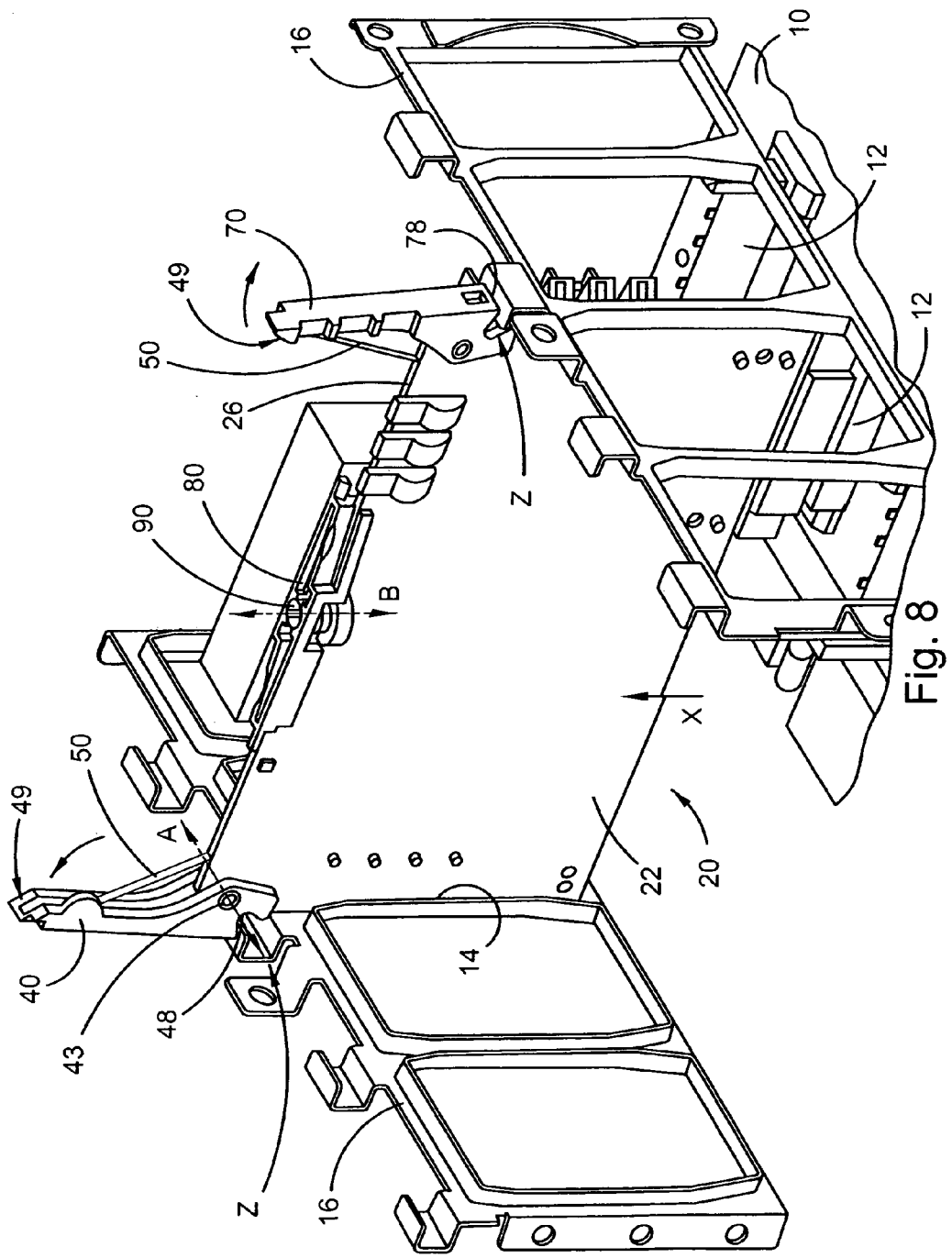

In accordance with the present invention, the daughterboard 20 includes a first lever 40 pivotably mounted to the printed circuit board 22 via a hinge pin 42. Thus, the first lever 40 may be positioned in an open position (see FIG. 8), in which the first lever 40 will not interfere with the housing/card guide 16 during removal of the daughterboard 20 from the motherboard's connector 12, as best shown in FIG. 8. Thus, the daughterboard 20 is freely removable from the motherboard 10 while the first lever 40 is in the open position. The first lever 40 is pivotable about a first axis A between the open position and a closed position (see FIGS. 1–3), in which the first lever 40 will interfere with the housing 16 to prevent removal of the daughterboard from the connector 12, as best shown at Z in FIG. 3.

Figure 3:
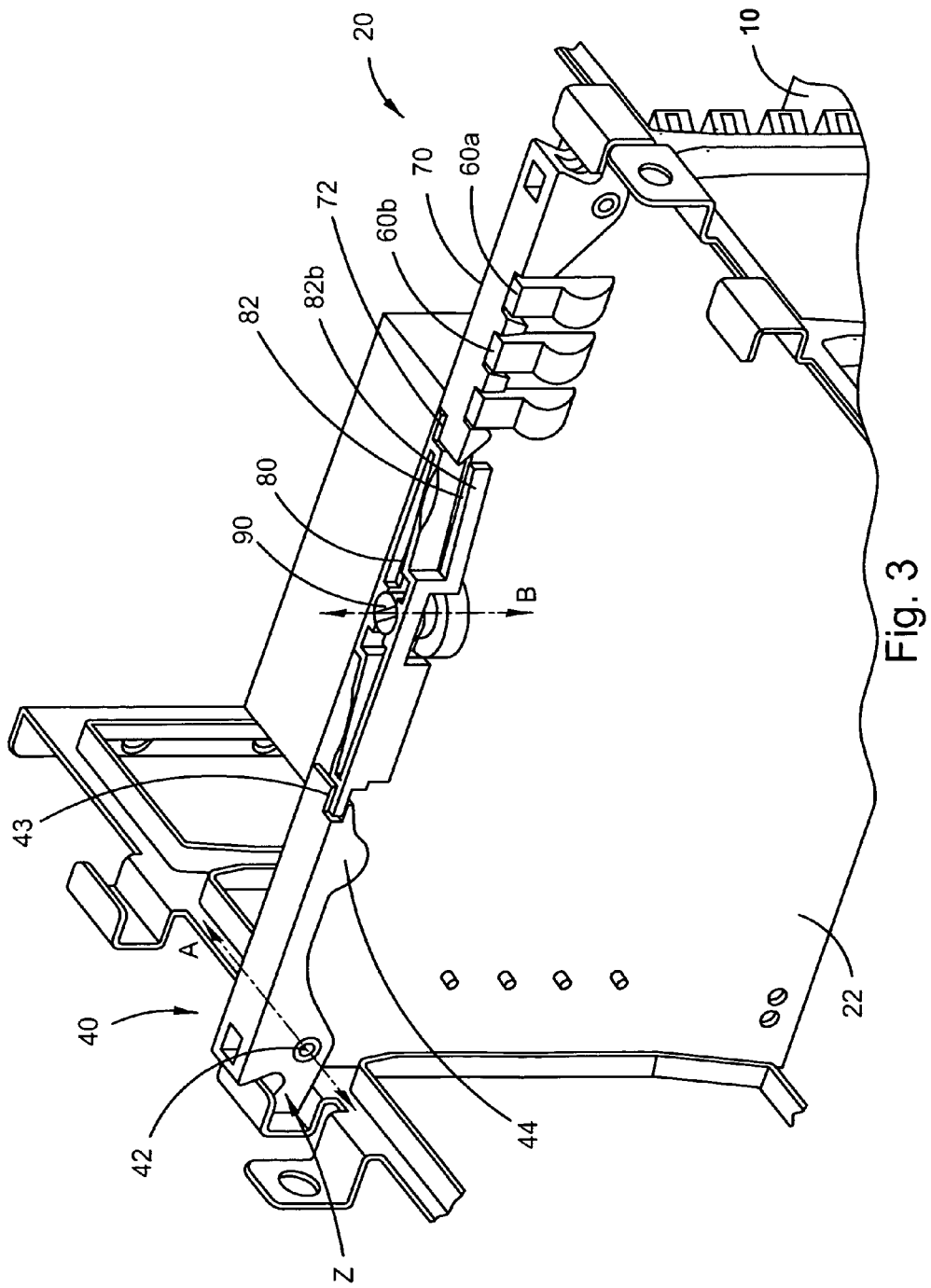
Figure 4:
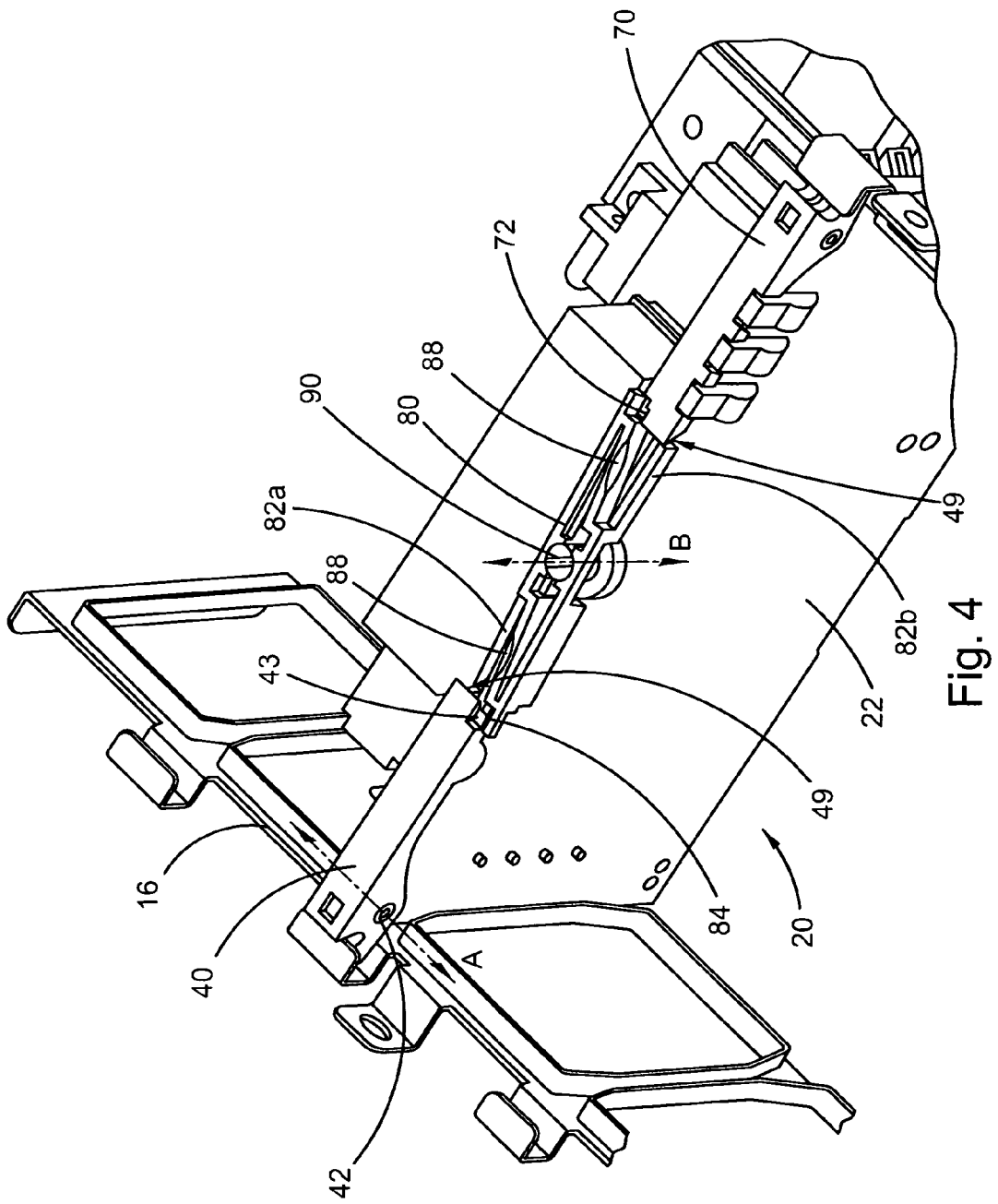
FIGS. 4, 5, 6, 7 and 8 are bottom perspective views of the daughterboard of FIG. 1, showing operation of the latch member and levers of in the inventive sense and release system.
Figure 5:
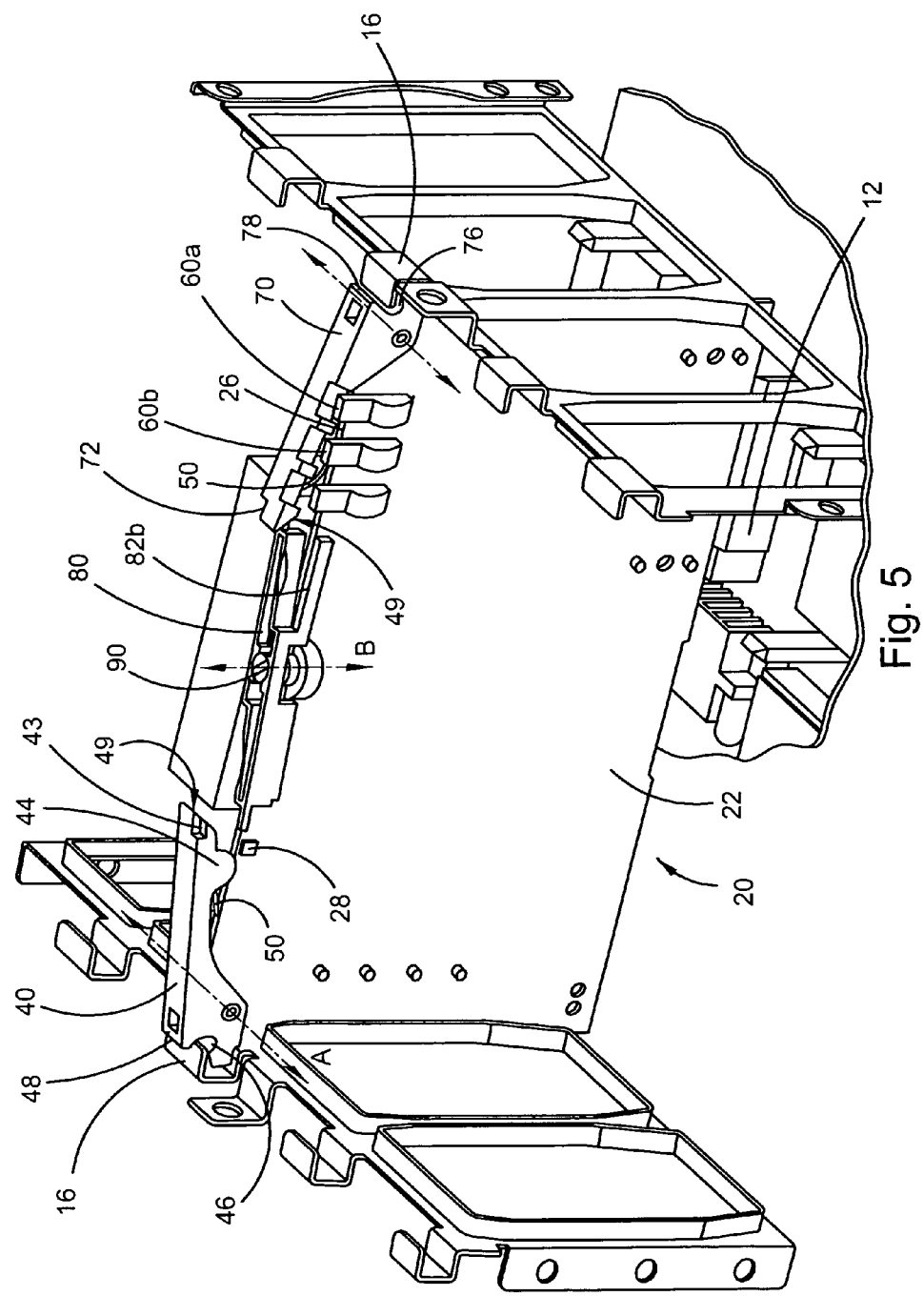
Figure 5A:
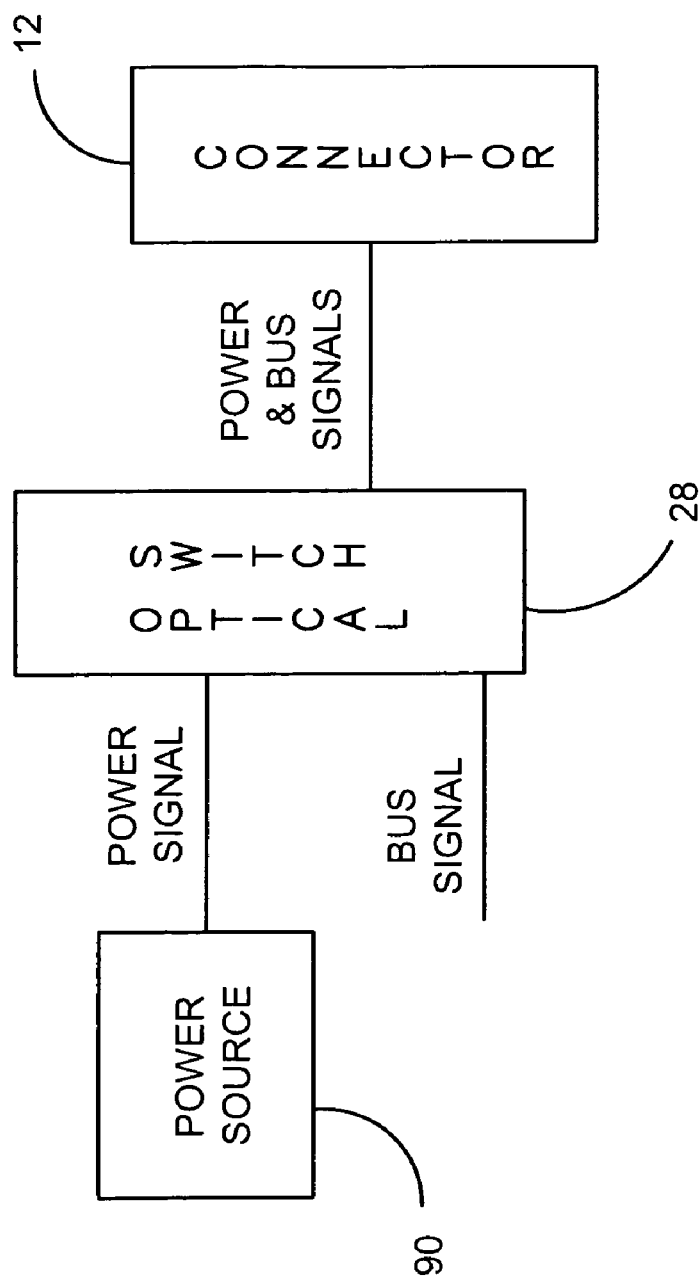
FIG. 5A is a block diagram showing operation of the optical switch of the inventive sense and release system.
Figure 6:
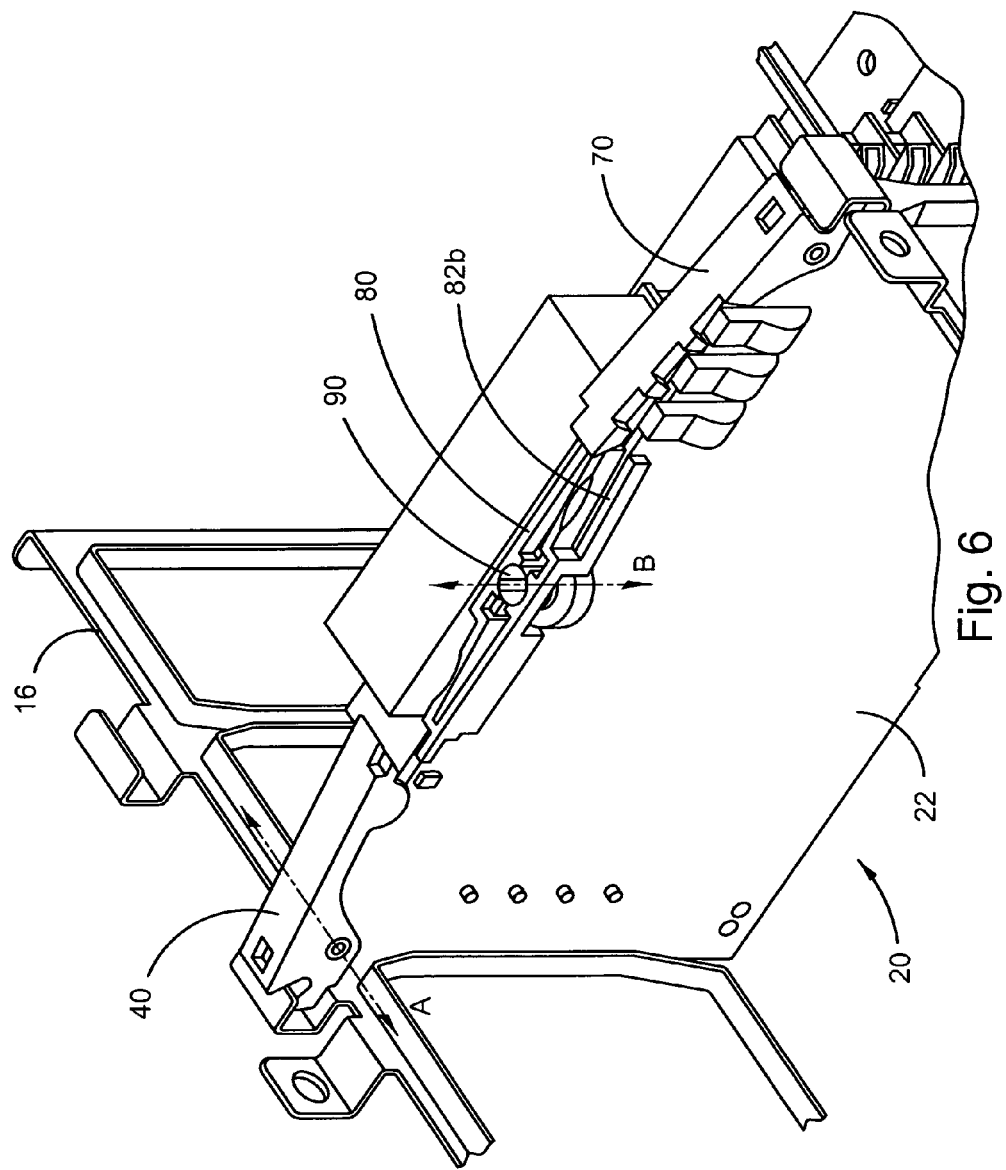
Figure 7:
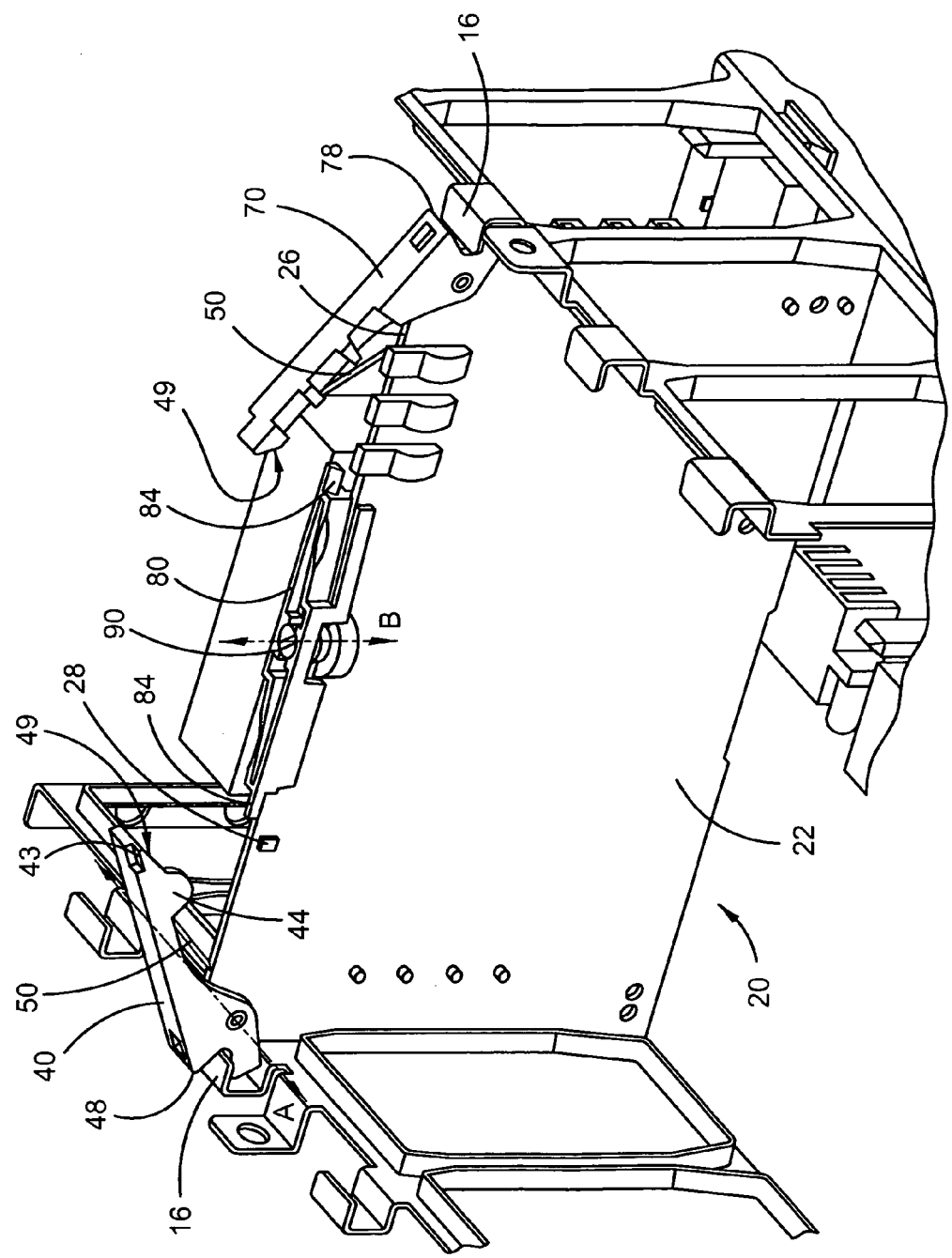

In the exemplary embodiment of FIGS. 1–8, a spring biasing member is mounted to the first lever 40. The spring biasing member biases the first lever 40 toward the open position. The spring biasing member may be provided in any suitable manner. In a preferred embodiment, the spring biasing member is provided as a resilient cantilevered tang 50. In a preferred embodiment, the tang 50 is integrally formed with the first lever 40, e.g. by injection molding. The tang 50 is preferably positioned to ride on the upper edge 26 of the printed circuit board 22 to provide the biasing action, as best shown in FIGS. 5, 7 and 8 for a second lever discussed below. Alternatively, a separate member may be inserted molded with the first lever 40 or may be attached to the printed circuit board.

Optionally, as shown in FIGS. 3, 4 and 5, the first lever 40 includes a shoulder 43 for registering with a latch member, as discussed below.

In a certain embodiment, the daughterboard 20 is specially configured for hot pluggability. In such an embodiment, the daughterboard 20 includes an optical switch 28 coupled to printed circuit board 22. The optical switch 28 has first and second states, that are toggled as a function of whether a structure is present adjacent the optical switch 28, as discussed in greater detail below. The optical switch 28 is used to determined whether the card is fully seated/properly installed in a connector, and whether the card is about to be removed from such a connector. In accordance with the present invention, the first lever 40 is used as the structure for toggling the optical switch. More specifically, the optical switch 28 is controlled by the first lever 40 such that the optical switch is in the first state (indicates a fully seated daughterboard state) when the first lever 40 is in the closed position (as in FIG. 2), and such that the optical switch 28 is in the second state (indicating a removal/pre-insertion state) when the first lever 40 is in the open position (as in FIG. 8), or not in the closed position (as in FIG. 5).

In the exemplary embodiment shown, the first lever 40 includes a tab 44 for controlling the optical switch 28, as best shown in FIGS. 2 and 5. The tab 44 is placed in a position adjacent the optical switch 28 when the first lever 40 is in the closed position (FIG. 2). Further, the tab 44 is removed from the position adjacent the optical switch 28 when the first lever 40 is not in the closed position (FIG. 5). Thus, the tab/lever serves to open and close the optical switch. In such an embodiment, the spring biasing cantilevered tang 50 of the first lever 40 is configured to bias the first lever 40 to a position in which the tab 44 is removed from the position adjacent the optical switch 28.

Accordingly, the position of the first lever 40 provides an indication of whether a card is fully seated or about to be removed from the system. Thus, the first lever 40 and optical switch 28 can be used to enable safe hot pluggability by powering down the daughterboard 20 when it is about to be removed from the system, but before removal. Methods for doing so are well known and/or straightforward, and so are not discussed in greater detail here. At least one discussion of exemplary technology is disclosed in U.S. Pat. No. 6,182,173 to Grosser, et al., which is incorporated herein by reference. To help ensure that the daughterboard 20 is not removed before it has been powered down, the daughterboard 20 may include a light source electrically connectable to the power source for the information processing system. The light source thus can be used to provide an indication of whether power is being currently received by the printed circuit board 22. Operation of the light source is controlled by the optical switch in that opening of the optical switch causes powering down of the daughterboard, which results in extinguishing of the light source. More specifically, closing of the optical switch 28 by presence of the first lever adjacent the optical switch 28 can be used to initiate powering of the daughterboard. Further, opening of the optical switch 28 by absence of the first lever 40 adjacent the optical switch 28 can be used to initiate powering down of the daughterboard. A light source, such as an LED 60a and/or lightpipe/LED combination 60b (FIGS. 3, 5), can be used to indicate whether the printed circuit board is currently receiving power, e.g. to be illuminated when the printed circuit board is receiving power, and to be extinguished when the printed circuit board is not receiving power. Thus, a technician would begin removal by lifting the first lever 40 to open the optical switch 28, but would not remove the daughterboard 20 from the motherboard's connector 12 until the light source 60a/60b was no longer illuminated.

Optionally, the daughterboard 20 further includes a second lever 70 similar to the first lever 40 (see FIGS. 1–8). Thus, the second lever 70 is pivotably mounted to the printed circuit board 22 and is pivotable between an open position and closed position, as best shown in FIGS. 1 and 8. A similar spring biasing member may be provided, as best shown in FIGS. 2 and 5.

Optionally, at least one of the first lever 40 and second lever 70 includes cam surfaces for facilitating insertion and removal of the daughterboard during mating with the motherboard. Preferably, both the first and second levers include such cam surfaces. More specifically, one or both levers 40, 70 includes a first cam surface 46, 76 for registering with the housing 16 as best shown in FIG. 5. Thus, the first cam surface 46, 76 urges the printed circuit board 22 into a fully seated position with the connector 12 of the information processing system as each lever is pivoted toward its closed position (see FIGS. 5 and 3). Further, one or both levers 40, 70 further includes a second cam surface 48, 78 for registering with the housing 16 as best shown in FIGS. 7 and 8. Thus, the second cam surface 48, 78 urges the printed circuit board 22 out of a fully seated position with the connector 12 of the information processing system as each lever is pivoted toward the open position, as best shown in FIGS. 7 and 8.

In accordance with the present invention, the daughterboard 20 further includes a latch member 80 pivotably mounted to the printed circuit board 22, as shown in FIGS. 1–8. Preferably, the latch member 80 is freely rotatably mounted on a pivot post 90 fixedly joined to the printed circuit board 22, as best shown in FIG. 4. The latch member 80 is pivotable about a second axis B between a latch position (see FIGS. 1–3 and 5–8) and an unlatch position (see FIG. 4). The latch member 80 is capable of retaining the first and second levers 40, 70 in their respective closed positions when the latch member 80 is in the latch position, as best shown in FIG. 3. Further, the latch member 80 is capable of permitting the first and second levers 40, 70 to be moved to their respective open positions when the latch member 80 is in the unlatch position, as best shown in FIG. 4. Optionally, the latch member 80 may include convex fingerholds 88 to facilitate manual grasping of the latch member, as best shown in FIG. 4.

In the exemplary embodiment of FIGS. 1–8, each lever 40, 70, includes a respective shoulder 43, 72. The shoulder 34, 72 is recessed into a surface of the respective lever 40, 70 for registering with the latch member 80 when the levers are in their respective closed positions, and the latch member 80 is in its latch position, as best shown in FIG. 3.

Further, the latch member 80 preferably includes a spring biasing member biasing the latch member 80 to the latch position. The spring biasing member is preferably provided as a resilient cantilevered tang 82 that is integrally formed with the latch member 80. The tang 82 is preferably positioned on the latch member 80 to abut the printed circuit board 22 and resiliently deflect as the latch member 80 is pivoted from the latch position toward the unlatch position. Thus, resiling of the tang 82 returns the latch member 80 to the latch position. In a preferred embodiment, the latch member 80 includes a pair of opposing tangs 82a, 82b, as shown in FIGS. 1–4.

In the exemplary embodiment of FIGS. 1–8, both the latch member 80 and the levers 40, 70 include an inclined surface 49 as best shown in FIGS. 4 and 7. These inclined surfaces 49, cause the latch member 80 to pivot toward the unlatch position as the levers 40, 70 impinge upon the latch member 80 as the levers are moved to the closed position. Thus, a technician need only rotate the levers 40, 70 to their respective closed positions, and the latch member 80 will automatically pivot to its unlatched position to allow the levers 40, 70 to be fully closed. The latch member 80 will then resile to latch the levers 40, 70 in their respective closed positions. The technician is not required to directly manipulate the latch member 80.

FIGS. 4–8 show operation of the latch member and levers of the inventive sense and release system during removal of an exemplary daughterboard 20 from a motherboard 10 of an information processing system proceeds as follows. First, the latch member 80 is pivoted from its latch position, as shown in FIG. 4. This may be done manually, without the need for any tools. Pivoting of the latch member 80 to the unlatch position causes the resilient tangs 82a, 82b to deflect as they engage the printed circuit board 22 while the latch member 80 continues to pivot. This continues until the latch member 80 reaches its unlatch position (see FIG. 4), in which the latch member moves clear of the levers 40, 70, at which point the levers 40, 70 are no longer retained in their closed position by the latch member 80.

After the latch member 80 clears the levers 40, 70, the spring biasing tangs 50 of the levers 40, 70 resile and cause the levers 40, 70 to pivot upwardly away from their respective closed positions, as shown in FIG. 5. This pivoting causes the lever 40 and/or its tab 44 to move away from and open the optical switch 28, as shown in FIG. 5. Appropriate circuitry senses opening of the optical switch 28 and thus senses that the daughterboard 20 is about to be removed from the information processing system. Accordingly, such circuitry causes the daughterboard 20 to be powered down, while maintaining electrical power to other components of the information processing system so that the daughterboard may be safely removed from the system in a "hot pluggable" manner. Powering down of the daughterboard 20 operates a light source/LED, etc. of the daughterboard 20, e.g. by extinguishing a "POWER ON" light 60a or 60b of the daughterboard 20. This provides a visual indication to the technician that the daughterboard 20 has been powered down and removal of the daughterboard 20 from the motherboard 10 may be continued in a safe manner. Further, opening of the optical switch 28 causes interruption of bus signals to the daughterboard 20.

A technician may manually release the latch member 80 at this point, and the resilient tangs 82a, 82b of the latch member 80 will resile and cause the latch member 80 to return to the latch position, as best shown in FIG. 6.

Referring now to FIGS. 7 and 8, the technician may then manually pivot the levers 40, 70 further upwardly toward the open position (FIG. 7). The pivoting of the levers causes the second cam surfaces 48, 78 to abut a portion of the housing 16/card guide structure and provides a camming/leverage action that urges the daughterboard 20 upwardly and out of engagement with the connector 12 of the motherboard. As the levers 40, 70 reach the open position, the daughterboard 20 has been released from the connection 12 of the motherboard an the levers have rotated to a position in which they will not interfere with the housing 16/card guide structure (see A, FIG. 8) during removal of the daughterboard form the card guide structure and its channel 14, as shown in the X direction in FIG. 8.

Installation of the daughterboard 20 begins with inserting the daughterboard into the card guide structure 16 of the information processing system, with the levers 40, 70 in the open position. After aligning the daughterboard's connector 27 with the motherboard's complementary connector 12, the levers 40, 70 may be manually pivoted toward their closed positions. The levers 40, 70 may impinge upon the housing 16 and urge the daughterboard into a fully seated position. As the levers 40, 70 impinge upon the latch member 80, the latch member 80 pivots toward the unlatch position to permit the levers to reach their closed positions. This causes the latch member's biasing tangs 82a, 82b to deflect. After the levers 40, 70 reach their closed positions, the resilient tangs 82a, 82b resile and cause the latch member 80 to return to the latch position, thereby latching the levers 40, 70 in the closed position. The optical switch 28 senses the lever 40 in the closed position and initiates restoration of power and bus signals to the daughterboard 20. Restored power to the daughterboard 20 causes the "POWER ON" light source 60a/60b to illuminate.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A daughterboard for electrical connection to a connector of an information processing system having a housing, the daughterboard comprising:
    a printed circuit board, said printed circuit board having a lower edge and an upper edge opposite said lower edge, said printed circuit board including adjacent said lower edge a complementary connector configured to mate with said connector of the information processing system;
    a first lever pivotably mounted to said printed circuit board, said first lever being pivotable about a first axis between an open position, in which said first lever will not interfere with said housing during removal of said daughterboard from said connector, and a closed position, in which said first lever will interfere with said housing to prevent removal of said daughterboard from said connector; and
    a rigid latch member pivotably mounted to said printed circuit board, said latch member being pivotable between a latch position and an unlatch position, said latch member being pivotable about a second axis substantially perpendicular to said first axis, said latch member being capable of retaining said first lever in the closed position when said latch member is in the latch position, and said latch member permitting said first lever to be moved to the open position when said latch member is in the unlatch position.

2. The daughterboard of claim 1, further comprising;
    a spring biasing member biasing said latch member to the latch position.

3. The daughterboard of claim 2, wherein said spring biasing member comprises a resilient cantilevered tang that is integrally formed with said latch member.

4. The daughterboard of claim 2, further comprising:
    a second lever pivotably mounted to said printed circuit board, said second lever being pivotable between an open position, in which said second lever will not interfere with the housing during removal of said daughterboard from the connector, and a closed position, in which said second lever will interfere with the housing to prevent removal of said daughterboard from said connector;
    said latch member being capable of retaining both said first lever and said second lever in their respective closed positions when said latch member is in the latch position, and said latch member permitting both said first lever and said second lever to be moved to their respective open positions when said latch member is in the unlatch position.

5. The daughterboard of claim 4, wherein at least one of said first lever and said second lever comprises:
    a first cam surface configured to register with the housing and urge said printed circuit board into a fully seated position with the connector of the information processing system as said at least one of said first lever and said second lever is pivoted toward the closed position; and
    a second cam surface configured to register with the housing and urge said printed circuit board out of said fully seated position with the connector of the information processing system as said at least one of said first lever and said second lever is pivoted toward the open position.

6. The daughterboard of claim 1, wherein said first lever comprises a shoulder recessed into a surface of said lever for registering with said latch member when said first lever is in the closed position and said latch member is in the latch position.

7. The daughterboard of claim 1, further comprising:
    a spring biasing member mounted to said first lever, said spring biasing member biasing said first lever toward the open position when said latch member is in the unlatch position.

8. The daughterboard of claim 7, wherein said spring biasing member comprises a resilient cantilevered tang that is integrally formed with said first lever.

9. The daughterboard of claim 1, wherein at least one of said first lever and said latch member comprises an inclined surface causing said latch member to pivot toward the unlatch position as said first lever impinges upon said latch member as it is moved to the closed position.

10. The daughterboard of claim 9, further comprising;
    a spring biasing member biasing said latch member to the latch position.

11. The daughterboard of claim 1, further comprising:
    an optical switch coupled to said printed circuit board, said optical switch having first and second states, said optical switch being controlled by said first lever such that said optical switch is in the first state when said first lever is in the closed position, and such that said optical switch is in the second state when said first lever is not in the closed position.

12. The daughterboard of claim 11, wherein said first lever includes a tab for controlling said optical switch, said tab being placed in a position adjacent said optical switch when said first lever is in the closed position, said tab being removed from said position adjacent said optical switch when said first lever is not in the closed position.

13. The daughterboard of claim 12, further comprising:
a spring biasing member mounted to said first lever, said spring biasing member biasing said first lever to a position in which said tab is removed from said position adjacent said optical switch when said latch member is in the unlatch position.

14. The daughterboard of claim 13, said printed circuit board further comprising:
a light source electrically connectable to a power source, said light source providing an indication of whether power is being currently received by said printed circuit board, illumination of said light source being controlled by said optical switch.

15. An information processing system comprising:
a housing;
a connector for receiving a daughterboard, said connector being coupled to said housing;
a daughterboard for electrical connection to said connector, said daughterboard comprising:
a printed circuit board, said printed circuit board having a lower edge and an upper edge opposite said lower edge, said printed circuit board including adjacent said lower edge a complementary connector configured to mate with said connector;
a first lever pivotably mounted to said printed circuit board, said first lever being pivotable about a first axis between an open position, in which said first lever will not interfere with said housing during removal of said daughterboard from said connector, and a closed position, in which said first lever will interfere with said housing to prevent removal of said daughterboard from said connector;
a rigid latch member pivotably mounted to said printed circuit board, said latch member being pivotable between a latch position and an unlatch position, said latch member being pivotable about a second axis substantially perpendicular to said first axis, said latch member being capable of retaining the first lever in the closed position when said latch member is in the latch position, and said latch member permitting said first lever to be moved to the open position when said latch member is in the unlatch position;
an optical switch coupled to said printed circuit board, said optical switch having first and second states, said optical switch being controlled by said first lever such that said optical switch is in the first state when said first lever is in the closed position, and such that said optical switch is in the second state when said first lever is in the open position; and
a power source for supplying electrical power to said connector, said power source being controlled by said optical switch such that electrical power from said power source to said connector is switched on when said optical switch is in the first state, and such that electrical power from said power source to said connector is switched off when said optical switch is not in the first state.

16. The information processing system of claim 15, further comprising;
a spring biasing member biasing said latch member to the latch position.

17. The information processing system of claim 15, further comprising:
a spring biasing member biasing said first lever toward the open position when said latch member is in the unlatch position.

18. The information processing system of claim 15, wherein
at least one of said first lever and said latch member comprises an inclined surface causing said latch member to pivot toward the unlatch position as said first lever impinges upon said latch member as it is moved to the closed position.

19. The information processing system of claim 15, said printed circuit board further comprising:
a light source electrically connectable to said power source, said light source providing an indication of whether power is being currently received by said printed circuit board.

20. In an information processing system having a connector for receiving a daughterboard and a bus for electrically coupling the daughterboard to the bus wherein the bus carries power and bus signals to the daughterboard, a system for removing and attaching the daughterboard to the bus while power is applied to the information processing system, said system comprising:
a daughterboard comprising:
a printed circuit board, said printed circuit board having a lower edge and an upper edge opposite said lower edge, said printed circuit board including adjacent said lower edge a complementary connector configured to mate with the connector of the information processing system;
a first lever pivotably mounted to said printed circuit board, said first lever being pivotable about a first axis between an open position, in which said first lever will not interfere with said housing during removal of said daughterboard from said connector, and a closed position, in which said first lever will interfere with said housing to prevent removal of said daughterboard from the connector; and
a rigid latch member pivotably mounted to said printed circuit board, said latch member being pivotable between a latch position and an unlatch position, said latch member being pivotable about a second axis substantially perpendicular to said first axis, said latch member being capable of retaining said first lever in the closed position when said latch member is in the latch position, and said latch member permitting said first lever to be moved to the open position when said latch member is in the unlatch position;
an optical switch configured to connect power and bus signals to said daughterboard when said first lever is in the closed position, said optical switch being further configured to disconnect power and bus signals to said daughterboard when said first lever is not in the closed position.

21. In the information processing system of claim 20, said latch member comprising a first spring biasing member biasing said latch member to the latch position, said first lever comprising a second spring biasing member biasing said first lever toward the open position when said latch member is in the unlatch position, at least one of said first lever and said latch member comprising an inclined surface causing said latch member to pivot toward the unlatch position as said first lever impinges upon said latch member as it is moved to the closed position.

* * * * *